United States Patent [19]

Voyce et al.

[11] Patent Number: 4,929,906
[45] Date of Patent: May 29, 1990

[54] AMPLIFIER LINEARIZATION USING DOWN/UP CONVERSION

[75] Inventors: Kenneth G. Voyce, Bellevue; Jay H. McCandless, Issaquah, both of Wash.

[73] Assignee: The Boeing Company, Seattle, Wash.

[21] Appl. No.: 299,950

[22] Filed: Jan. 23, 1989

[51] Int. Cl.$^5$ .......................... H03F 1/32; H03C 1/06
[52] U.S. Cl. ....................................... 330/149; 332/162
[58] Field of Search ............... 330/149, 286, 290, 291, 330/302, 306, 311; 455/119, 126; 332/162

[56] References Cited

U.S. PATENT DOCUMENTS

| | | | |
|---|---|---|---|
| 1,997,407 | 4/1935 | Hofer | 330/106 X |
| 2,011,566 | 8/1935 | Black | 330/106 X |
| 2,133,410 | 10/1938 | Wirkler | 332/37 D |
| 2,245,598 | 6/1941 | Llewellyn | 330/106 X |
| 2,250,172 | 7/1941 | Wilson | 330/106 X |
| 2,298,930 | 10/1942 | Decino | 332/37 D |
| 2,877,423 | 3/1959 | Webster | 332/37 D |
| 3,900,823 | 8/1975 | Sokal et al. | 330/149 |
| 3,927,420 | 12/1975 | Hayashi et al. | 360/65 |
| 4,243,955 | 1/1981 | Daniel et al. | 455/126 X |
| 4,481,672 | 11/1984 | Watkinson | 455/126 X |
| 4,618,999 | 10/1986 | Watkinson | 455/126 X |
| 4,682,119 | 7/1987 | Michel | 330/149 |
| 4,706,262 | 11/1987 | Ohta | 455/126 X |

FOREIGN PATENT DOCUMENTS

| | | | |
|---|---|---|---|
| 55-39469 | 3/1980 | Japan . | |
| 56-80806 | 7/1981 | Japan . | |
| 0159176 | 10/1982 | Japan | 332/162 |

OTHER PUBLICATIONS

Petrovic, V. and Smith, C. N., "The Design of VHF SSB Polar-Loop Transmitters", presented at Conv. on Comm. Equipt. and Systems, Birmingham, U.K, Apr. 20–22, 1982.

Weaver, C. F. and Taylor, D. P., "Feedback Linearization of Power Amplifiers for Digital Microwave Communications", *IEEE*, 1982.

Gadja, G. B. and Douville, R. J. P., "A Linearization System Using R.F. Feedback", Paper No. 83021, IEEC and E, pp. 30–33, 1983.

Petrovic, V., "Reduction of Spurious Emission from Radio Transmitters by Means of Modulation Feedback", *Conservation Techniques*, pp. 44–49, 1983.

Akaiwa, Y. and Nagata, Y., "Highly Efficient Digital Mobile Communications with a Linear Modulation Method", *IEEE Journal on Selected Areas in Communications* 5(5), 890–895, 1987.

Hsieh, C.-C. and Strid, E., Farinon Electric, Hybrid Circuit Development Dept., San Carlos, CA, "A S--Band High Power Feedback Amplifier", pp. 182–184.

*Primary Examiner*—Steven Mottola
*Attorney, Agent, or Firm*—Christensen, O'Connor, Johnson & Kindness

[57] ABSTRACT

A feedback linearization technique for a power amplifier that does not require the availability of the modulation signals. The RF input signal is down converted to a first IF signal. A portion of the amplifier RF output signal is used to form a feedback signal that is down converted to produce a second IF signal that is subtracted from the first IF signal to produce a different signal. The difference signal is filtered and amplified, and then up converted to RF for input to the power amplifier. Use of feedback at IF avoids stability problems inherent in RF feedback techniques.

13 Claims, 4 Drawing Sheets

AMPLIFIER LINEARIZATION USING DOWN/UP CONVERSION

FIELD OF THE INVENTION

The present invention relates to circuits for linearizing amplifiers, and in particular, to circuits for linearizing power amplifiers used in RF communication systems.

BACKGROUND OF THE INVENTION

An amplifier's gain and phase delay transfer characteristics may be constant at low power levels. However, as the drive level is increased, the phase delay increases, and the rate of gain change decreases, up to that drive level where the amplifier saturates. This nonlinearity of the gain and phase delay with drive level caused distortion in the transmitted signal. The amount of distortion decreases as the output power level is backed off from saturation. In data transmission techniques such as quadrature amplitude modulation (QAM), data is encoded as the amplitude and phase of an RF carrier signal. Thus, the distortion caused by amplifier nonlinearity can directly lead to data errors.

Because of distortion, a system requiring a linear amplifier must operate a power amplifier well backed off from saturation. To achieve a lower distortion level for a specified output power, a larger amplifier must be used. However, there is a penalty for increased linearity: the power added efficiency of the amplifier decreases as one backs off from saturation. Because of this inherent tradeoff between linearity and efficiency, there is a large incentive to compensate or linearize the amplifier, so that it can operate in a linear fashion closer to its saturation level. This lowering of the amount of distortion allows the use of a smaller amplifier at a given output power level, to thereby increase the efficiency of the amplifier.

To date, attempts to linearize the gain and phase delay of amplifiers have fallen into four main categories: predistortion; feed forward; RF feedback; and modulation feedback. Predistortion treats an amplifier as a black box with a transfer function. By judicious choice of another black box in front of the amplifier, with opposing gain and phase delay vs. drive transfer characteristics, the nonlinearities in the amplifier can be cancelled out, leaving a linear system.

The predistortion technique suffers from three main problems. The choice of proper transfer curves often must be done by eye. Yet many modern applications requiring linear amplifiers need extremely low distortion levels, where the distortion is due to very small nonlinearities that cannot be discriminated by the eye. Each predistortion linearizer must be individually tuned, increasing production costs. Finally, although the compensation is unconditionally stable because it is open loop, it nevertheless cannot compensate for variations caused by age and environmental changes.

Feedforward linearization involves coupling off the input and output of the amplifier, then comparing the two signals directly at the carrier frequency. One then takes the error signal, amplifies it, and sums it back in with the output signal. As with predistortion, this is an open loop technique, unable to adapt. It also requires two power amplifiers, giving only a marginal increase in efficiency.

The third category of prior linearizers employs negative RF feedback to increase linearity. This dynamic technique is more tolerant to circuit and environmental changes, requires little or no production tuning, and usually gives better results. However, at RF and microwave frequencies, the dimensions of the loop become significant. Negative feedback requires that the feedback signal be 180° out of phase with the input signal. However, if the circuit has a large delay, then phase variation with frequency can render the loop unstable. This means that the loop gain must have a very narrow bandwidth, limiting its usage to very narrow band systems, which are difficult to build, or to low frequency systems. This is particularly true for long amplifier chains or traveling wave tube amplifiers, where the loop is multiple wavelengths long.

Modulation feedback is a more recent technique that is similar to RF feedback. In many communications systems, the power amplifier is used as the transmitter, sending an information-bearing modulated carrier. Modulation feedback linearizes both the modulation process and the transmitting amplifier. It does this by demodulating a small coupled off portion of the output signal, and comparing it to the base band modulating signal. The difference can then be used to control the modulation process, giving both gain and phase delay compensation. The main drawback of this technique is that it cannot be used in a repeater, where the original modulating signal is unavailable.

SUMMARY OF THE INVENTION

The present invention provides a feedback linearization technique that achieves essentially all of the linearization capability of a modulation feedback configuration, without requiring the modulation signals to be available, and without requiring construction of an entire receiver to produce the modulation signals. The invention provides this capability without introducing the stability problems inherent in prior RF feedback techniques.

In a preferred embodiment, the invention provides a circuit for linearizing an amplifier, the circuit including first and second down conversion means and up conversion means. The first down conversion means receives the RF input signal to be amplified, and converts it to a first IF signal. A coupler is connected to the output terminal of the amplifiers, and divides the amplifier output signal into an RF output signal and a feedback signal. The second down conversion means converts the feedback signal to a second IF signal. The first and second IF signals are subtracted from one another to produce an IF difference signal, and the up conversion means converts the difference signal to an RF signal that is coupled to the input terminal of the amplifier. Preferably, the feedback loop includes an IF bandpass filter for filtering the IF difference signal, and an amplifier for amplifying the difference signal. The up conversion means may comprise a single sideband up converter, and RF bandpass filter may be provided to filter the RF output signal.

DETAILED DESCRIPTION OF THE INVENTION

Figure 1:
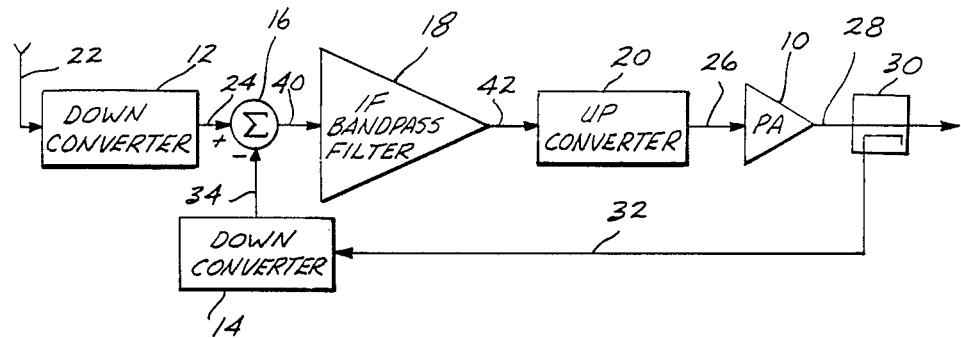
FIG. 1 is a block diagram illustrating a preferred embodiment of the present invention.

The linearization technique of the present invention is illustrated in a generalized way in FIG. 1. The illustrated circuit linearizes power amplifier (PA) 10, and comprises down converters 12 and 14, summing junction 16, IF bandpass filter 18, and up converter 20. An RF input signal on line 22 is input to down converter 12, and the down converter produces a corresponding lower frequency IF signal on line 24. This IF signal forms one of the inputs to summing junction 16. Power amplifier 10 receives an amplifier input signal on line 26, and produces an amplifier output signal on line 28. Coupler 30 picks off a portion of the amplifier output signal to form a feedback signal on line 32 that is input to down converter 14. Down converter 14 converts the feedback signal to a corresponding lower frequency IF signal on line 34 that forms the second input to summing junction 16. The summing junction subtracts the IF signal on line 34 from the IF signal on line 24, to produce a difference signal on line 40.

The difference signal is filtered by bandpass filter 18 to produce a filtered difference signal on line 42. The filtered difference signal is up converted by up converter 20, to produce the RF amplifier input signal on line 26. Down converters 12 and 14 and up converter 20 all use the same local oscillator (not shown), such that up converter 18 produces an amplifier input signal having the same frequency as the RF input signal on line 22. The amplifier input signal represents the original RF input signal, plus a "predistortion" component that signal therefore has the same amplitude and phase as it would have had if the amplifier were operating in a linear portion of its range.

The circuit shown in FIG. 1 operates generally by comparing the RF input signal to the amplifier output signal, and by adjusting the input signal so that a predetermined (i.e., linear) relationship is established between the input and output signals. By use of the down and up conversions, the present invention compares the input and output signals and filters the difference signal at a lower IF frequency, rather than at the RF frequency of the input signal. This permits a far greater range of choices for implementing filter 18, so as to maximize the stability and efficiency, and minimize the cost, of the system.

In general, the IF frequency should be greater than the bandwidth required for the system. This bandwidth can be for multiple carriers, to allow advanced modulation techniques, or even to allow amplification of a signal of an unknown frequency, but within specified limits, as is the case with frequency hopping. The IF frequency must also be far enough away from the closet band edge to allow easy filtering at the carrier frequency, as described below.

Figure 2:
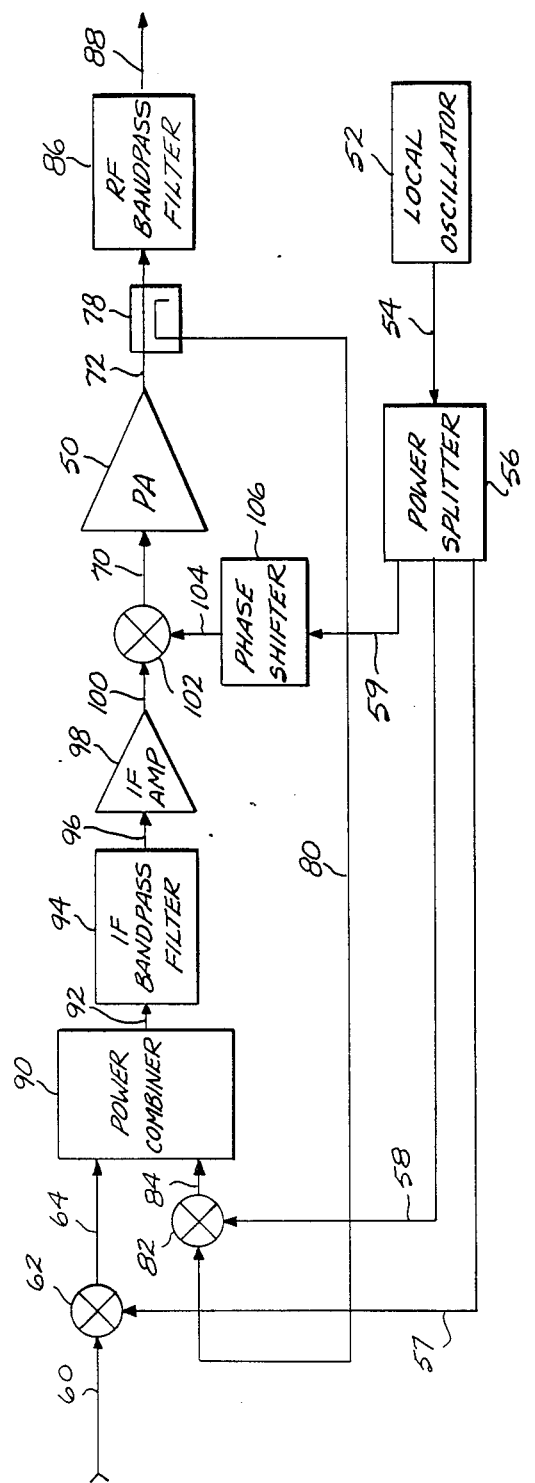
FIG. 2 is a block diagram of a preferred embodiment of the present invention.

A more detailed block diagram of a preferred embodiment of the invention is shown in FIG. 2, for linearizing power amplifier (PA)50. Local oscillator 52 provides an LO signal on line 54 that is input to power splitter 56. The power splitter produces copies of the LO signal on lines 57-59. The RF input signal on line 60 to is input mixer 62, and down converted by the mixer using the LO signal on line 57 to produce an IF signal on line 64. Power amplifier 50 receives an amplifier input signal on line 70, and produces an amplifier output signal on line 72. Coupler 78 picks off a portion of the amplifier output signal, to form a feedback signal on line 80. The feedback signal is down converted by mixer 82 using the LO signal on line 58, to produce a second IF on line 84.

The IF signals on lines 64 and 84 are input to power combiner 90. The power combiner subtracts the IF signal on line 84 from the IF signal on line 56, to produce an IF difference signal on line 92 that is input to IF bandpass filter 94. A vector addition takes place in the power combiner, such that the phase and amplitude of the difference signal are predistorted to achieve linearization of the power amplifier. The bandpass filter produces a filtered IF difference signal on line 96 that is input to IF amplifier 98, and the resulting amplified difference signal on line 100 is input to up converter 102 that preferably comprises a single sideband (SSB) up convertor. It will be appreciated that IF bandpass filter 94 and IF amplifier 98 could be realized by a single circuit that performs both filtering and amplifying functions. Up converter 102 performs the up conversion using a phase shifted LO signal on line 104, to produce the amplifier input signal on line 70. The phase shifted LO signal is produced by phase shifter 106 from the LO signal on line 59. Phase shifter 106 is preferably manually adjustable, to provide a convenient way of controlling the phase of the up converted RF signal on line 70, to provide the negative feedback required for loop stability. The amplifier output signal on line 72 is input to RF bandpass filter 86, to produce a system RF output signal on line 88.

The operation of the system shown in FIG. 2 can readily be understood by describing a particular example. For this example, it will be assumed that the RF input signal on line 60 has a frequency of 450 MHz. The goal is to amplify this RF input signal, to produce the RF output signal on line 88 that is linearly related to the input signal in amplitude, and that has a constant phase delay with respect to the input signal. For such an input signal, for reasons described below, a suitable frequency for LO signal 54 is 430 MHz. Mixer 62 down converts the RF input signal to a first IF signal on line 64 at an IF frequency of 20 MHz. Similarly, mixer 82 down converts the feedback signal on line 80 to a second IF signal on line 84 at a frequency of 20 MHz. These IF signals are subtracted from one another by power combiner 90 to produce the difference signal on line 92. This difference signal is then filtered by IF bandpass filter 94 that has a center frequency of 20 MHz and a bandwidth smaller than 20 MHz, e.g., 1.0 MHz. The filtered difference signal is then amplified by IF amplifier 98, and up converted to 450 MHz using up converter 102. The up converted signal on line 70 is then input to power amplifier 50. By using amplifier 98 at an IF rather than an RF frequency, it is significantly easier to increase loop gain, without introducing instability. In general, the arrangement shown in FIG. 2 can be applied to systems having percentage bandwidths of up to five percent or more, and are applicable from the UHF to the Ku band.

If up converter 102 is a balanced (rather than an SSB) up converter, then the signal on line 70 will include both sum and difference terms, e.g., signals at 450 and 410 MHz. A primary function of RF bandpass filter 86 is to eliminate the 410 MHz component, such that the output signal on line 88 contains only the 450 MHz component. If the bandpass filter is of a sufficiently high order, then it will be capable of suppressing the 410 MHz signal to a sufficient degree for many purposes. However, in such a case half of the power produced by power amplifier 50 will be wasted, because it will amplify a signal that will later be filtered from the system before producing the RF output signal. This in turn will tend to defeat the goal of operating the power amplifier closer to its saturation level for a given output power level. However, use of an SSB up converter causes the 410 MHz component on line 70 to be attenuated by about 20 DB with respect to the 450 MHz component. Thus the SSB up converter partially attenuates the unwanted difference component, to thereby make the system operate more efficiently and simplify the design of RF bandpass filter 86.

In those cases in which the elimination of the difference component is not a significant concern, RF bandpass filter 86 could be eliminated, and/or up converter 102 could be a balanced rather than an SSB up converter. It would also be possible to use a balanced up converter in conjunction with a RF bandpass filter placed between up converter 102 and power amplifier 50. However the inclusion of an additional filter in the loop will often produce stability problems, degrading the overall performance of the system.

The production of sum and difference signals by up converter 102, even when an SSB up converter is used, tends to set a practical lower limit for the IF frequency. As described above, the unwanted difference signal on line 70 will be spaced from the RF signal frequency by twice the IF frequency. Thus for example if an IF frequency of 1 MHz were used, there would only be 2 MHz difference between the RF frequency and the unwanted difference frequency. This would require a complex RF bandpass filter 86 to separate the unwanted signal from the desired signal, and in undesirable attenuation in the RF bandpass filter. The IF signal should of course be low enough to simplify the design of the circuit, and/or to increase the effectiveness of the IF bandpass filter. For the case in which the IF frequency is near base band, e.g., 1 MHz, then IF bandpass filter 94 could comprise a lowpass filter having a DC response. The term "bandpass filter", as used herein, should be understood to include such a low pass filter.

Figure 3:
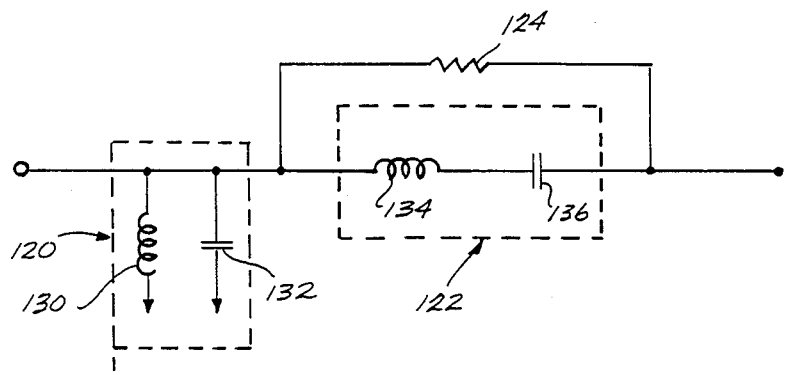
FIG. 3 is a circuit diagram of an IF bandpass filter.

A principle advantage of the amplifier linearizer of the present invention, in contrast to prior linearizers in which the entire feedback loop is at the RF frequency, is that it permits use of a more effective IF bandpass filter 94 for a given degree of cost and complexity. In a preferred embodiment, IF bandpass filter 94 is a two-pole, single zero filter such as the filter shown in FIG. 3. This filter comprises a first tuned circuit 120 and a second tuned circuit 122, circuit 122 being shunted by a resistor 124. Circuit 120 comprises inductor 130 and capacitor 132 connected in parallel, while circuit 122 comprises inductor 134 and capacitor 136 connected in series. For the example given above, each of circuits 120 and 122 resonates at the IF frequency of 20 MHz. The circuit shown in FIG. 3 contains two poles and one zero, and thus provides a steeper passband and allows more loop gain over a given band in comparison to single pole filters used in prior RF feedback linearizers. It will be appreciated that many other filters would be equivalent or substantially equivalent to the filter shown in FIGURE 3. For example, resistor 124 could be connected in series with circuit 120, rather than parallel to circuit 122.

Figure 4:
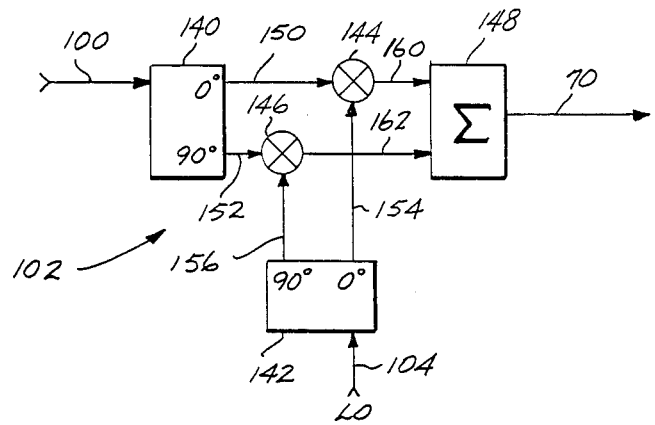
FIGS. 4 is a block diagram of a single sideband up converter.

A suitable way of implementing up converter 102 as an SSB up converter is shown in FIG. 4. The illustrated up converter includes 90° hybrids 140 and 142, mixers 144 and 146, and power combiner 148. the amplified and filtered error signal on line 100 is input to hybrid 140, and the hybrid divides the signal into an in-phase component on line 150 and a quadrature component on line 152. Similarly, hybrid 142 receives the phase shifted local oscillator signal on line 104, and divides the phase shifted local oscillator signal into an in-phase component on line 154 and a quadrature component on line 156. The in-phase components on lines 150 and 154 are mixed by mixer 144 to produce an in-phase up converted signal component on line 160, while mixer 146 mixes the quadrature components on lines 152 and 156 to produce quadrature up converted signal component on line 162. The up converted signal components on lines 160 and 162 are then combined by power combiner 148 to produce the amplifier input signal on line 70.

Figure 5:
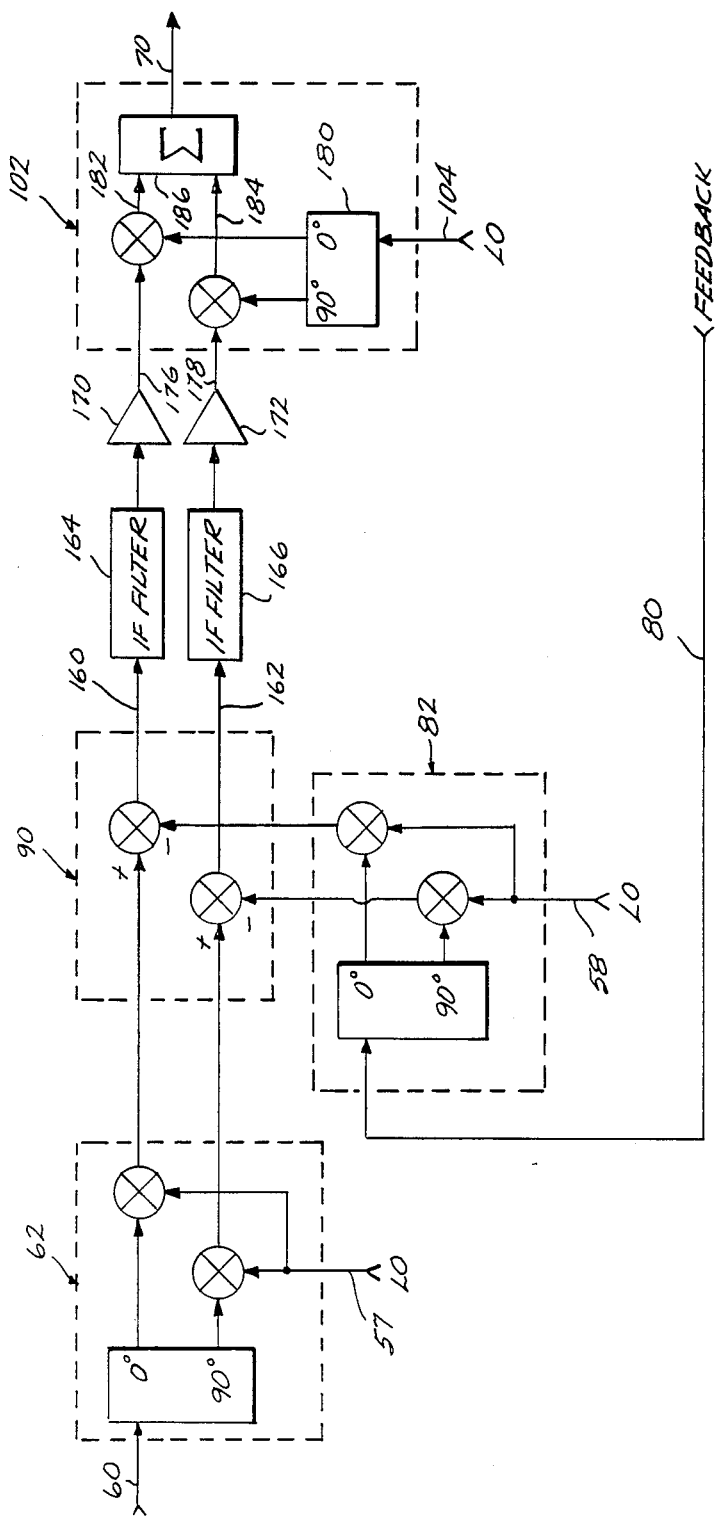
FIG. 5 is a partial block diagram of an embodiment that used in-phase and quadrature difference signals.

For systems in which the IF signal is relatively close to base band, there may be situations in which implementation of hybrid 140 is relatively difficult, because a large percentage bandwidth is required. In such a system, the arrangement shown in FIG. 5 may be used. Down converters 62 and 82 both use a 90° hybrid and pair of mixers to produce both in-phase and quadrature signals, and the in-phase and quadrature signals are the separately combined in power combiner 90 to produce in-phase difference signal 160 and quadrature difference signal 162. These difference signals are filtered by IF bandpass filters 164 and 166, respectively, and amplified by IF amplifiers 170 and 172, respectively, to produce in-phase and quadrature amplified difference signals 176 and 178, respectively. For this embodiment, up converter 102 includes 90° hybrid 180 for dividing the phase shifted local oscillator signal on line 104 into in-phase and quadrature components, which components are then separately mixed with the in-phase and quadrature signals on lines 176 and 178, to produce up converted signal components on lines 182 and 184, respectively. The up converted components are combined by combiner 186 to produce the amplifier input signal on line 70.

Figure 6:
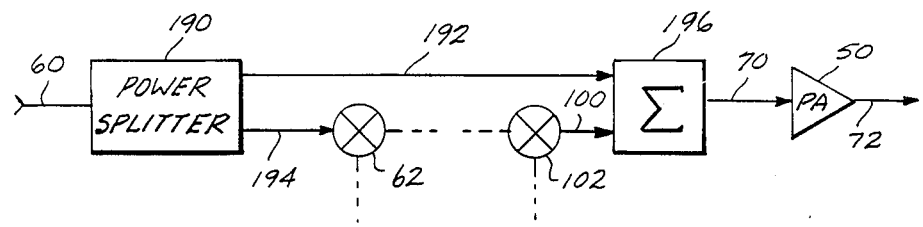
FIG. 6 is a partial block diagram of an embodiment of the invention in which a portion of the RF input signal is fed through to the power amplifier; and, FIG. 7 is a graph illustrating the improvement achieved by the present invention.

FIG. 6 is a partial illustration of a further embodiment of the invention. The RF input signal on line 60 is divided by power splitter 190 into a first RF input signal on line 192 and a second RF input signal on line 194. The RF input signal on line 194 is input to down converter 62, in a manner identical to that shown in FIG. 2. The RF input signal on line 192 is input directly to power combiner 196. The other input to power combiner 196 is the up converted signal on line 100 produced by up converter 102, as in the previously described embodiments. The output of combiner 196 forms the amplifier input signal on line 70. Thus in this embodiment, a portion of the original RF input signal is directly fed through, and is summed with the up converted difference signal on line 100 to form the input to the power amplifier. This embodiment may be of use in those case wherein it is wished to minimize the drive requirements for the feedback path. For such an embodiment, both paths from line 60 to summer 196 should in general have equal time delays.

Figure 7:
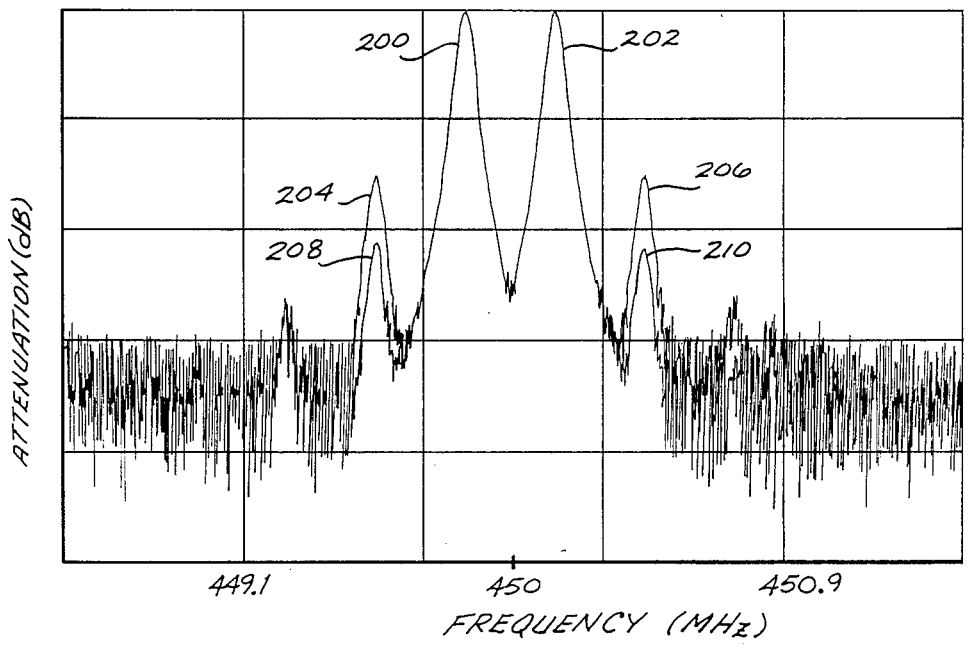

FIG. 7 illustrates the results of a two-tone modulation test using the present invention, for the example given above with an RF signal at 450 MHz and and IF frequency of 20 MHz. The graph present a spectrum analysis of the RF output signal for the case in which the RF input signal comprised a pair tones at 449.85 MHz and 450.15 MHz, and in which power amplifier 50 was driven to within 5 dB of its lid 1 dB compression point. The vertical axis shows gain or attenuation in dB, at a scale of 20 dB per division, while the horizontal axis shows frequency at a scale of 0.3 MHz per division. Peaks 200 and 202 correspond to the input tones, while peaks 204 and 206 show the first intermodulation products with the loop open, i.e., without using the linearization technique of the present invention. The size of the intermodulation peaks is known to correspond to the degree of distortion in the power amplifier. Peaks 208 and 210 show the corresponding first intermodulation products using the linearization technique of the present invention. These intermodulation products were suppressed about 12 dB in comparison with the open loop condition. This improvement would allow the use of a power amplifier of ¼ the size of an unlinearized amplifier, with a corresponding improvement in cost and efficiency.

While the preferred embodiments of the invention have been illustrated and described, variations will be apparent to those skilled in the art. Accordingly, the invention is not limited to described embodiments, but is defined by the following claims.

The embodiments of the invention in which an exclusive property or privilege is claimed are defined as follows:

1. A circuit for linearizing an amplifier, the amplifier having input and output terminals and means for amplifying an amplifier input signal at the input terminal to produce an amplifier output signal at the output terminal, the circuit comprising:
   first down conversion means for receiving an RF input signal to be amplified and for down converting the RF input signal to produce a first IF signal;
   coupler means connected to the output terminal of the amplifier, the coupler means including means for dividing the amplifier output signal to produce an RF output signal and a feedback signal;
   second down conversion means connected to the coupler means for down converting the feedback signal to produce a second IF signal;
   combining means connected to the first and second down conversion means for subtracting one IF signal from the other IF signal to produce a difference signal;
   up conversion means connected to the combining means and to the input terminal of the amplifier, for up converting the difference signal to produce the amplifier input signal and for coupling the amplifier input signal to the input terminal of the amplifier.

2. The circuit of claim 1, further comprising bandpass filter means connected between the combining means and the up conversion means, for bandpass filtering the difference signal.

3. The circuit of claim 2, wherein the bandpass filter means comprises a bandpass filter having at least two poles.

4. The circuit of claim 2, further comprising IF amplifier means for amplifying the difference signal.

5. The circuit of claim 1, wherein the up conversion means comprises a single sideband up converter.

6. The circuit of claim 1, further comprising an RF bandpass filter for filtering the RF output signal.

7. The circuit of claim 1, comprising a local oscillator for providing a local oscillator signal, and wherein the first and second down conversion means and the up conversion means perform their respective down and up conversions using the local oscillator signal.

8. The circuit of claim 7, further comprising means for phase shifting the local oscillator signal used by the up conversion means.

9. The circuit of claim 1, further comprising power splitter means connected to receive the RF input signal and connected to the first down conversion means, the power splitter means comprising means for dividing the RF input signal into first and second RF input signals and for coupling the second RF input signal to the first down conversion means, the circuit further comprising second combining means coupled to the power splitter means and to the up conversion means, the second combining means including means for combining the first RF input signal with an up converted difference signal produced by the up conversion means, to produce the amplifier input signal.

10. The circuit of claim 1, wherein the first down conversion means down converts the RF input signal to produce in phase and quadrature first IF signals, wherein the second down conversion means down converts the feedback signal to produce in phase and quadrature second IF signals wherein the combining means combines the in phase first and second IF signals to produce an in phase difference signal and combines the quadrature first and second IF signals to produce a quadrature difference signal, and wherein the up conversion means up converts and combines the in phase and quadrature difference signals to produce the amplifier input signal.

11. The circuit of claim 10, further comprising first bandpass filter means connected between the combining means and the up conversion means for bandpass filtering the in phase difference signal, and second bandpass filter means connected between the combining means and the up conversion means for bandpass filtering the quadrature difference signal.

12. The circuit of claim 11, further comprising first IF amplifier means for amplifying the in phase difference signal, and second IF amplifier means for amplifying the quadrature difference signal.

13. The circuit of claim 11, wherein each bandpass filter means comprises a bandpass filter having at least two poles.

* * * * *